United States Patent [19]

Levy

[11] 4,389,340
[45] Jun. 21, 1983

[54] FLEXIBLE, ELECTRICALLY CONDUCTIVE JOINTING MATERIAL, PARTICULARLY SUITABLE FOR AIRCRAFT

[75] Inventor: Fernand J. Levy, Puteaux, France

[73] Assignee: Avions Marcel Dassault-Breguet Aviation, Vaucresson, France

[21] Appl. No.: 175,853

[22] Filed: Aug. 6, 1980

[30] Foreign Application Priority Data

Aug. 10, 1979 [FR] France ................................ 79 20499

[51] Int. Cl.³ .............................................. H01B 1/02
[52] U.S. Cl. .................................. 252/512; 252/511; 524/437
[58] Field of Search ....................... 252/511, 512, 518; 174/35 C, 36; 260/37 M, 42.27, 37 SB, 37 R, 42.26; 106/290, 291; 75/138; 339/275 R; 524/401, 437

[56] References Cited

U.S. PATENT DOCUMENTS

| | | | |
|---|---|---|---|
| 3,140,342 | 7/1964 | Ehrreich et al. | 252/511 |
| 3,998,779 | 12/1976 | Baer | 252/512 |
| 4,147,669 | 4/1979 | Shoheen et al. | 252/512 |
| 4,312,793 | 1/1982 | Charneski et al. | 260/37 M |

*Primary Examiner*—J. L. Barr
*Attorney, Agent, or Firm*—A. W. Breiner

[57] ABSTRACT

A flexible, electrically conductive jointing material consists of an elastomer containing metal in a divided state distributed in its mass. The metal is in the form of laminae or paillettes of aluminium or of aluminium alloy, the length of which is greater than their width or thickness. The elastomer, which may be the product known under the name "Thiokol", exhibits a pasty consistency when applied enabling it to be spread with a spatula and mixed *in situ*. The jointing material may be used for connecting together the structural parts of aircraft.

4 Claims, No Drawings

FLEXIBLE, ELECTRICALLY CONDUCTIVE JOINTING MATERIAL, PARTICULARLY SUITABLE FOR AIRCRAFT

This invention relates to flexible, electrically conductive jointing material which is particularly suitable for use in aircraft.

The considerable development of electronic devices which has taken place in the field of aeronautics makes the problem of the electromagnetic protection of aircraft more acute. Electrically conductive joints are amongst the elements which make it possible to ensure satisfactory functioning of the equipments installed on board. Such joints may be used to improve the bonding of certain equipment or to reinforce electromagnetic protection structures.

In the case of bonding, it is sometimes necessary to ensure homogeneous electrical contact between a piece of equipment and a structure accommodating that piece of equipment, for example in the case of certain antennae the functioning of which depends on a conductive reference plan correctly established. This contact is obtained by the interposition of a conductive joint between the surfaces to be electrically connected together. In the case of electromagnetic protection, it is a matter of producing a closed structure which encloses the equipment like a Faraday cage at the level of the fuselage. It is known that any discontinuity or interruption in the electrical connection of the parts forming such a structure adversely affects the screening efficiency with respect to external radiation which is likely to interfere with the working of the equipment installed within the structure. Such continuity defects are present, for instance, in the vicinity of the openings in the fuselage, such as access doors, inspection hatches etc, giving rise to gaps through which interference energy may pass. Besides a reduction in screening efficiency, because of the effect of resonance at certain frequencies, these gaps may also give rise to amplification of the local interference field and may act as an actual generator of interference energy.

In order to prevent these drawbacks, it is therefore important to provide uninterrupted electrical connections. This is achieved by means of electrically conductive joints which are interposed in the gaps existing between adjacent electrically conductive surfaces.

Of the known electrically conductive jointing materials, some have good electromagnetic properties but are poorly adapted for aeronautical use because of their tendency to form galvanic couples with the metal constituting the structure of the aircraft, and/or their high density, and/or their poor resistance to external agents likely to be encountered in use, such as hydraulic fluids of the "Skydrol" type, fuels for jet engines and lubricating oils.

In fact, no known product combines all the qualities necessary to enable it to be used completely satisfactorily in any area of the aircraft.

The flexible, electrically conductive jointing material described in U.S. Pat. No. 3,140,342 is generally cut to the desired shape from a sheet of conductive elastomer, is then placed between the metal surfaces between which it is desired to provide an electrical connection, and is clamped between those surfaces by means of special screws or bolts. The hardness of such jointing material is generally between 50 and 80 so that, in order to ensure adequate clamping of the material, it is necessary to apply pressure of up to several tens of bars to the material. In addition, this pressure enables the electrical characteristics of the jointing material to be improved. In effect, the elastomers used for producing the flexible electrically conductive jointing material are made conductive by the incorporation either of metallic powders such as silver or silvered copper powder (due to the excellent electrical properties of these two metals), or of one or more metal screens of steel wire, namely "Monel" or similar. This latter type of joint, however, cannot really be considered a truly elastic joint. As regards the first type of joint, it should be noted that each particle making up the metallic powder is separated from the adjacent particle by a more or less significant thickness of elastomer determined by the proportion of metallic powder added to the elastomer base. This thickness diminishes on clamping, thus improving the electrical contact between the metal particles.

There is a tendency, therefore, to increase the metallic powder content of the elastomer as much as possible. However, an excess of powder causes the joint to lose its suppleness and cohesion, whilst considerably increasing its specific weight, which is undesirable in the intended application, since the density of the metals used is between 7 and 10.6 (or even 19.3 when gold is used).

These considerations have led the applicants to perfect a new flexible, electrically conductive jointing material which offers optimum performance when used in aircraft.

According to the invention, there is provided flexible, electrically conductive jointing material consisting of an elastomer containing metal in a divided state distributed in its mass, wherein the elastomer, when applied at the desired site, exhibits a pasty consistency enabling it to be spread with a spatula or similar and to be molded in situ, and the metal is in the form of laminae or paillettes (hereinafter called "scales") the length of which is greater than their width and thickness.

The material which forms the subject of this invention may be obtained starting from a commercial elastomer such as that known under the name of "Thiokol" on a polysulphide liquid polymer base which vulcanises at ambient temperature under the action of an acelerator. This product, which is obviously not by itself conductive, is often used just as it is to obtain water or air tightness between certain metallic or dielectric elements and a metal structure on which they rest. The product is generally applied by spatula to the fixed part of the assembly, after which the mobile part is put into place and fixed by means of special screws or bolts. The paste-like elastomer, compressed between these two rigid surfaces, sets gradually into an elastic mass which absorbs the differences in inherent flatness between the adjacent surfaces and ensures the desired tightness.

The pressure exerted on such a joint moulded in situ must obviously be moderate. In order to make the elastomer conductive, therefore, one must rely on the quality of the contact between metallic particles incorporated in the material, as well as on the nature of the metal used. As regards the latter, one would be led quite naturally to have recourse to silver or silvered copper powder, but it is found that, when in contact with aluminum alloys which constitute the greater part of the fuselage of modern aircraft, these metals form a galvanic couple leading to latent corrosion in certain condiets.

In order to eliminate this risk of galvanic corrosion, the applicants have conducted tests on materials in which the incorporated metallic particles are powders of aluminium and its alloys. However, systematic tests made using aluminum powders of different granulometries have not given satisfactory results, so that it was necessasry to reject the use of aluminium powders.

In contrast, results have been astonishingly satisfactory after substituting for aluminum powder small scales of aluminium having on average, according to a preferred embodiment of the invention, a length of approximately 2 to 4 mm, a width of approximately 100 to 150 microns and a thickness of approximately 30 to 60 microns.

In order to prepare such a flexible, electrically conductive jointing material, a proportion of aluminium scales representing about 25% by weight of the elastomer, for example "Thiokol", may be incorporated in the elastomer.

"Thiokol" is currently supplied in 250 gram boxes together with a corresponding predosed container of accelerator. A sachet of 62.5 g of aluminium scales may be poured into such a box of 250 g of "Thiokol", after which the accelerator may be added and the mixture stirred with a spatula immediately before application.

A more "industrial" preparation of this elastomer containing aluminium scales may require the installation of a plasticising machine with a nozzle fed by an Archimedes screw taking the two essential constituents, namely the "Thiokol" or other suitable elastomer and the aluminium charge in the desired proportions, say 4 parts by weight of elastomer to 1 part by weight of aluminium.

In the resulting material the aluminium scales overlap one another and this overlapping multiplies the mutual points of contact. Moreover, the numerous scales even out the surface of the joint and link together by direct metal-to-metal contact the two metallic surfaces between which the joint is moulded, thus effecting better electrical contact across the gap between these surfaces, in spite of the lightness of the pressure exerted on the joint.

To sum up, this jointing material exhibits the following miscellaneous properties. It incorporates a metal which does not make a galvanic couple with the metal with which the material is to be in contact. In the example quoted, the metal is pure aluminium. However, any alloy of aluminium may be suitable, including those which are particularly oxidisable and which, after being reduced to scales, may be subjected to a conventional chemical conversion treatment which will protect them effectively from oxidation without adversely affecting their electrical conductivity. Other metals may be utilized depending on the use envisaged and the nature of the surrounding surfaces. Where aluminium is used, surprisingly low density flexible joints may be obtained, namely between 1.2 and 1.3, instead of 3.1 to 4.8 for flexible, electrically conductive joints utilizing silvered copper or silver powder. The scales have large surface areas which allows numerous and important zones of contact to be established between them. This is an advantage which makes possible relatively low proportions of scales in the material, for example 20% to 30% by weight of the elastomer, which leads to joint densities lower than those of metal powder joints of the same nature. The scales do not thicken the elastomer as a powder does, which allows flexible conductive joints to be made which, on being moulded in situ after spreading conveniently with the aid of a spatula, retain good elasticity and hardness between 50 and 75 Shore after vulcanisation.

Furthermore, the form of the material enables the manufacture of sheets of vulcanised conductive elastomer from which may be cut squeezable joints of any desired configuration. The scales may be associated with all the usual elastomers, such as polysulphides, polyurethanes, silicone and fluorosilicone.

I claim:

1. A composition of matter, for application to aircraft structural parts made of aluminum or aluminum alloy, comprising a flexible electrically-conductive jointing material consisting of a resilient electrically-insulating matrix formed of an elastomer selected as being, upon application at the desired site of the aircraft, of pasty consistency adapted for spreading and molding in situ, and of generally rectangular particles of aluminum or aluminum alloy distributed throughout said matrix and formed of scales having on average a length of approximately 2 to 4 millimeters, a width of approximately 100 to 150 microns and a thickness of approximately 30 to 60 microns, the proportion of scales in the elastomer being approximately of 1:4 parts by weight.

2. Composition as claimed in claim 1, wherein the elastomer has a liquid polysulphide polymer base which vulcanizes at ambient temperature under the action of an accelerator.

3. A jointing material for use as an electrically-conductive flexible seal to bond electrically-conductive metal surface portions of a structure, consisting of an electrically-insulating elastomer loaded with electrically-conductive metal particles distributed throughout its mass, wherein the metal of said particles is electrochemically compatible with the metal of said surface portions in that said metals do not form a galvanic couple, and said particles are in the form of generally rectangular scales having on average a length of approximately 2 to 4 millimeters, a width of approximately 100 to 150 microns and a thickness of approximately 30 to 60 microns, the proportion of said scales in said elastomer being approximately of 1:4 parts by weight, and wherein said elastomer, when applied at the desired site, exhibits a pasty consistency enabling it to be spread with a spatula for molding in situ upon setting into final flexible condition.

4. Material as claimed in claim 3, wherein said elastomer has a liquid polysulphide polymer base which vulcanizes at ambient temperature under the action of an accelerator.

* * * * *